(12) United States Patent
Zhang et al.

(10) Patent No.: US 11,580,671 B2
(45) Date of Patent: Feb. 14, 2023

(54) HASH-BASED ATTRIBUTE PREDICTION FOR POINT CLOUD CODING

(71) Applicant: TENCENT AMERICA LLC, Palo Alto, CA (US)

(72) Inventors: Xiang Zhang, Mountain View, CA (US); Wen Gao, West Windsor, NJ (US); Shan Liu, San Jose, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 42 days.

(21) Appl. No.: 17/317,053

(22) Filed: May 11, 2021

(65) Prior Publication Data

US 2022/0050816 A1 Feb. 17, 2022

Related U.S. Application Data

(60) Provisional application No. 63/066,583, filed on Aug. 17, 2020.

(51) Int. Cl.
*H03M 7/00* (2006.01)
*G06T 9/00* (2006.01)
*H03M 7/30* (2006.01)

(52) U.S. Cl.
CPC ......... *G06T 9/001* (2013.01); *H03M 7/3059* (2013.01)

(58) Field of Classification Search
CPC .... H03M 7/00; H03M 7/3088; H03M 7/6058; G06T 9/00; G06T 9/001; G06T 9/005; G06T 15/005; G06T 9/40; G06F 16/137; G06F 16/2282
USPC .................... 341/87, 106, 107, 51
See application file for complete search history.

(56) References Cited

U.S. PATENT DOCUMENTS

| | | | |
|---|---|---|---|
| 9,619,478 B1* | 4/2017 | Singh | G06F 11/3476 |
| 10,140,581 B1* | 11/2018 | Kiss | G06N 5/022 |
| 10,547,679 B1* | 1/2020 | Burnett | H04L 67/1095 |
| 2013/0151811 A1* | 6/2013 | McKenney | G06F 16/9014 711/221 |
| 2015/0271498 A1* | 9/2015 | Wang | H04N 19/89 375/240.02 |
| 2017/0031945 A1* | 2/2017 | Sarab | G06F 16/1748 |
| 2019/0155925 A1* | 5/2019 | Giannikis | G06F 16/221 |
| 2019/0156206 A1 | 5/2019 | Graham et al. | |

(Continued)

FOREIGN PATENT DOCUMENTS

| | | |
|---|---|---|
| WO | 2021/247216 A1 | 12/2021 |
| WO | 2022/186861 A1 | 9/2022 |

OTHER PUBLICATIONS

International Search Report dated Aug. 31, 2021 from the International Searching Authority in International Application No. PCT/US2021/035467.

(Continued)

*Primary Examiner* — Linh V Nguyen
(74) *Attorney, Agent, or Firm* — Sughrue Mion, PLLC

(57) ABSTRACT

A method, computer program, and computer system is provided for point cloud coding. Data corresponding to a point cloud is received. Hash elements corresponding to attribute values associated with the received data is reconstructed. A size of a hash table may be decreased based on deleting one or more of the hash elements corresponding to non-border regions associated with the attribute values. The data corresponding to the point cloud is decoded based on the reconstructed hash elements.

20 Claims, 10 Drawing Sheets

(56) References Cited

U.S. PATENT DOCUMENTS

| | | | |
|---|---|---|---|
| 2020/0120347 A1 | 4/2020 | Boyce | |
| 2020/0175725 A1 | 6/2020 | Mekuria | |
| 2020/0250032 A1* | 8/2020 | Goyal | H03M 13/373 |
| 2020/0342128 A1* | 10/2020 | Moll | H04L 9/16 |
| 2021/0312691 A1* | 10/2021 | Makar | G06T 9/00 |
| 2021/0407139 A1* | 12/2021 | Graziosi | H04N 19/70 |
| 2022/0207780 A1* | 6/2022 | Ramasubramonian | G06T 9/004 |

OTHER PUBLICATIONS

Written Opinion dated Aug. 31, 2021 from the International Searching Authority in International Application No. PCT/US2021/035467.

"Information technology—MPEG-I (Coded Representation of Immersive Media)—Part 9: Geometry-based Point Cloud Compression", ISO/IEC 23090-9:2019(E), ISO/IEC JTC 1/SC 29/WG 11, CD Stage, 2019, 104 pages.

Khaled Mammou, et al., "G-PCC codec description v2", 3DG, ISO/IEC JTC1/SC29/WG11, N18189, International Organisation for Standardisation Organisation Internationale De Normalisation, Coding of Moving Pictures and Audio, Jan. 2019, 39 pages, Marrakech, MA.

Christian Tulvan, et al., "Use Cases for Point Cloud Compression (PCC)", ISO/IEC JTC1/SC29/WG11 MPEG2015/N16331, International Organisation for Standardisation Organisation Internationale De Normalisation, Coding of Moving Pictures and Audio, Jun. 2016, 8 pages, Geneva, CH.

Rufael Mekuria, et al., "Requirements for Point Cloud Compression", ISO/IEC JTC1/SC29/WG11 MPEG2016/n16330, International Organisation for Standardisation Organisation Internationale De Normalisation, Coding of Moving Pictures and Audio, Feb. 2016, 3 pages, Geneva, CH.

"G-PCC codec description v7", International Organisation for Standardisation, ISO/IEC JTC1/SC29/WG11, Coding of Moving Pictures and Audio, ISO/IEC JTC1/SC29/WG11 N19331, Jun. 25, 2020, XP030289576 (119 pages total).

Extended European Search Report dated Nov. 4, 2022 from the European Patent Office in EP application No. 21858753.3.

Communication dated Nov. 22, 2022 from the European Patent Office in EP application No. 21858753.3.

* cited by examiner

| prediction_residual() { | Descriptor |
|---|---|
|   for ( i = 0; i < 3; i++) { | |
|     prediction_residual_is_zero[i] | ae(1) |
|     if ( !prediction_residual_is_zero[i] ) { | |
|       prediction_residual_is_one[i] | ae(1) |
|       if (!prediction_residual_is_one[i]) { | |
|         prediction_residual_is_two[i] | ae(1) |
|         if (!converted_prediction_residual_is_two[i]) { | |
|           prediction_residual_minus_three[i] | ue(v) |
|         } | |
|       } | |
|     } | |
|   } | |

HASH-BASED ATTRIBUTE PREDICTION FOR POINT CLOUD CODING

CROSS-REFERENCE TO RELATED APPLICATION

This application claims priority based on U.S. Provisional Application No. 63/066,583 (filed Aug. 17, 2020), the entirety of which is incorporated by reference herein.

FIELD

This disclosure relates generally to field of data processing, and more particularly to point cloud coding.

BACKGROUND

Point Cloud has been widely used in recent years. For example, it is used in autonomous driving vehicles for object detection and localization; it is also used in geographic information systems (GIS) for mapping, and used in cultural heritage to visualize and archive cultural heritage objects and collections, etc. Point clouds contain a set of high dimensional points, typically of three dimensional (3D), each including 3D position information and additional attributes such as color, reflectance, etc. They can be captured using multiple cameras and depth sensors, or Lidar in various setups, and may be made up of thousands up to billions of points to realistically represent the original scenes. Compression technologies are needed to reduce the amount of data required to represent a point cloud for faster transmission or reduction of storage.

SUMMARY

Embodiments relate to a method, system, and computer readable medium for point cloud coding. According to one aspect, a method for point cloud coding is provided. The method may include receiving data corresponding to a point cloud. Hash elements corresponding to attribute values associated with the received data is reconstructed. The data corresponding to the point cloud is decoded based on the reconstructed hash elements.

According to another aspect, a computer system for point cloud coding is provided. The computer system may include one or more processors, one or more computer-readable memories, one or more computer-readable tangible storage devices, and program instructions stored on at least one of the one or more storage devices for execution by at least one of the one or more processors via at least one of the one or more memories, whereby the computer system is capable of performing a method. The method may include receiving data corresponding to a point cloud. Hash elements corresponding to attribute values associated with the received data is reconstructed. The data corresponding to the point cloud is decoded based on the reconstructed hash elements.

According to yet another aspect, a computer readable medium for point cloud coding is provided. The computer readable medium may include one or more computer-readable storage devices and program instructions stored on at least one of the one or more tangible storage devices, the program instructions executable by a processor. The program instructions are executable by a processor for performing a method that may accordingly include receiving data corresponding to a point cloud. Hash elements corresponding to attribute values associated with the received data is reconstructed. The data corresponding to the point cloud is decoded based on the reconstructed hash elements.

BRIEF DESCRIPTION OF THE DRAWINGS

These and other objects, features and advantages will become apparent from the following detailed description of illustrative embodiments, which is to be read in connection with the accompanying drawings. The various features of the drawings are not to scale as the illustrations are for clarity in facilitating the understanding of one skilled in the art in conjunction with the detailed description. In the drawings:

FIG. 2E is a table of syntax elements for prediction residuals, according to at least one embodiment

DETAILED DESCRIPTION

Figure 1:
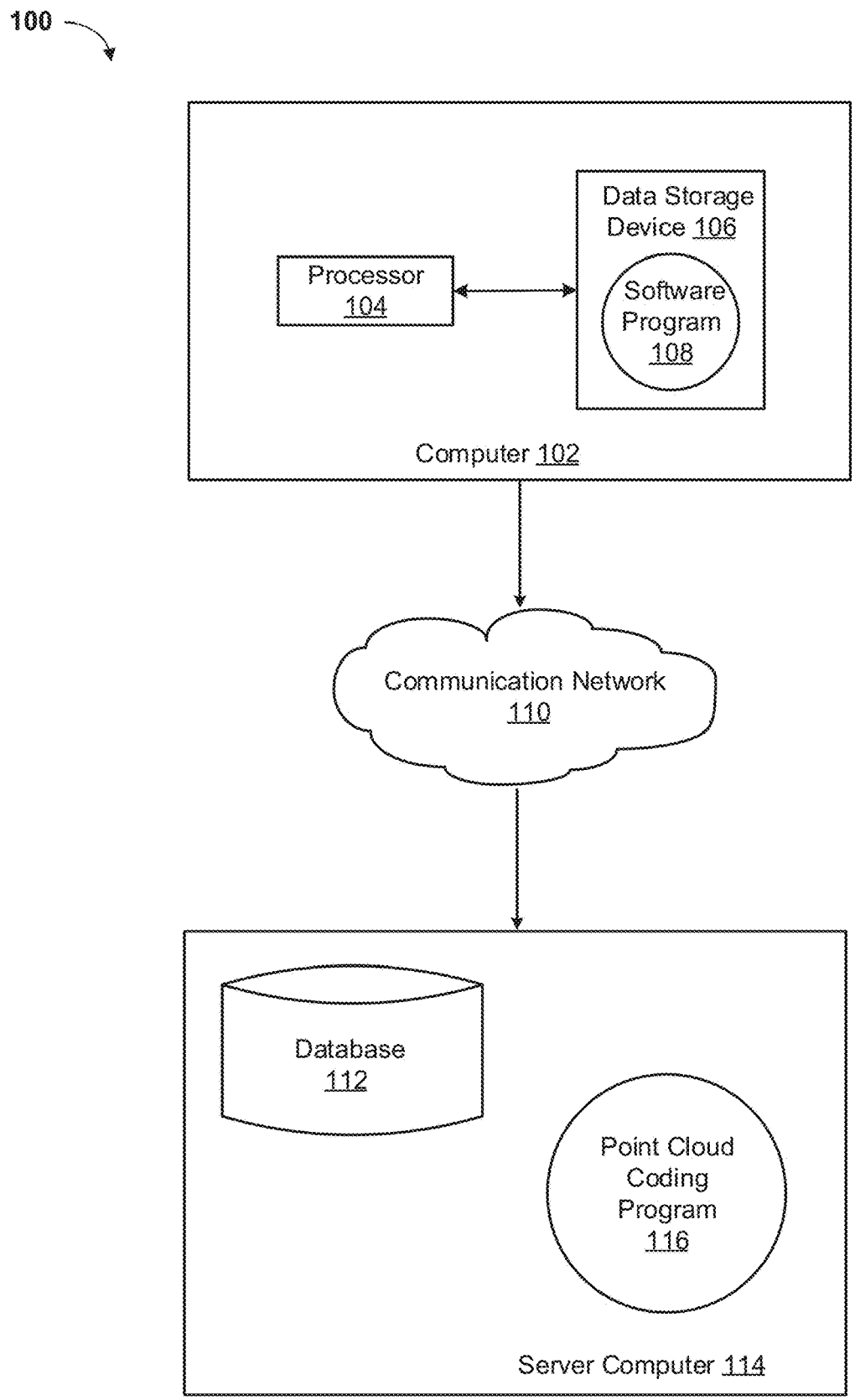
FIG. 1 illustrates a networked computer environment according to at least one embodiment.

Detailed embodiments of the claimed structures and methods are disclosed herein; however, it can be understood that the disclosed embodiments are merely illustrative of the claimed structures and methods that may be embodied in various forms. Those structures and methods may, however, be embodied in many different forms and should not be construed as limited to the exemplary embodiments set forth herein. Rather, these exemplary embodiments are provided so that this disclosure will be thorough and complete and will fully convey the scope to those skilled in the art. In the description, details of well-known features and techniques may be omitted to avoid unnecessarily obscuring the presented embodiments.

Embodiments relate generally to the field of data processing, and more particularly to point cloud coding. The following described exemplary embodiments provide a system, method and computer program to, among other things, use hash-based methods for coding point cloud attribute data. Therefore, some embodiments have the capacity to improve the field of computing by allowing for increased efficiency of point cloud coding by not requiring finding nearest neighbors of the point cloud data.

As previously described, Point Cloud has been widely used in recent years. For example, it is used in autonomous driving vehicles for object detection and localization; it is also used in geographic information systems (GIS) for mapping, and used in cultural heritage to visualize and archive cultural heritage objects and collections, etc. Point clouds contain a set of high dimensional points, typically of three dimensional (3D), each including 3D position information and additional attributes such as color, reflectance, etc. They can be captured using multiple cameras and depth sensors, or Lidar in various setups, and may be made up of thousands up to billions of points to realistically represent the original scenes. Compression technologies are needed to reduce the amount of data required to represent a point cloud for faster transmission or reduction of storage. In the prediction based attribute coding, the attribute of current point is predicted from the already coded points that are close to current point.

In the TMC13 model, the geometry information and the associated attributes, such as color or reflectance, are separately compressed. The geometry information, which is the 3D coordinates of the point clouds, is coded by octree-partition with its occupancy information. The attributes are then compressed based on reconstructed geometry using prediction, lifting and region adaptive hierarchical transform techniques. However, to find the nearest points in 3D space for each point may be expensive. Additionally, for lossless and near-lossless coding of multiple channel attributes, e.g., RGB colors, the multiple channels are processed directly without color space conversion and coded independently. However, there is usually a strong correlation among different color channels especially in RGB domain. Without utilizing such correlation may result in performance loss in terms of coding efficiency. It may be advantageous, therefore, to use hash-based prediction schemes and inter-component correlations.

Aspects are described herein with reference to flowchart illustrations and/or block diagrams of methods, apparatus (systems), and computer readable media according to the various embodiments. It will be understood that each block of the flowchart illustrations and/or block diagrams, and combinations of blocks in the flowchart illustrations and/or block diagrams, can be implemented by computer readable program instructions.

Referring now to FIG. 1, a functional block diagram of a networked computer environment illustrating a point cloud coding system 100 (hereinafter "system") for coding point cloud data. It should be appreciated that FIG. 1 provides only an illustration of one implementation and does not imply any limitations with regard to the environments in which different embodiments may be implemented. Many modifications to the depicted environments may be made based on design and implementation requirements.

The system 100 may include a computer 102 and a server computer 114. The computer 102 may communicate with the server computer 114 via a communication network 110 (hereinafter "network"). The computer 102 may include a processor 104 and a software program 108 that is stored on a data storage device 106 and is enabled to interface with a user and communicate with the server computer 114. As will be discussed below with reference to FIG. 4 the computer 102 may include internal components 800A and external components 900A, respectively, and the server computer 114 may include internal components 800B and external components 900B, respectively. The computer 102 may be, for example, a mobile device, a telephone, a personal digital assistant, a netbook, a laptop computer, a tablet computer, a desktop computer, or any type of computing devices capable of running a program, accessing a network, and accessing a database.

The server computer 114 may also operate in a cloud computing service model, such as Software as a Service (SaaS), Platform as a Service (PaaS), or Infrastructure as a Service (IaaS), as discussed below with respect to FIGS. 5 and 6. The server computer 114 may also be located in a cloud computing deployment model, such as a private cloud, community cloud, public cloud, or hybrid cloud.

The server computer 114, which may be used for point cloud coding is enabled to run a Point Cloud Coding Program 116 (hereinafter "program") that may interact with a database 112. The Point Cloud Coding Program method is explained in more detail below with respect to FIG. 3. In one embodiment, the computer 102 may operate as an input device including a user interface while the program 116 may run primarily on server computer 114. In an alternative embodiment, the program 116 may run primarily on one or more computers 102 while the server computer 114 may be used for processing and storage of data used by the program 116. It should be noted that the program 116 may be a standalone program or may be integrated into a larger point cloud coding program.

It should be noted, however, that processing for the program 116 may, in some instances be shared amongst the computers 102 and the server computers 114 in any ratio. In another embodiment, the program 116 may operate on more than one computer, server computer, or some combination of computers and server computers, for example, a plurality of computers 102 communicating across the network 110 with a single server computer 114. In another embodiment, for example, the program 116 may operate on a plurality of server computers 114 communicating across the network 110 with a plurality of client computers. Alternatively, the program may operate on a network server communicating across the network with a server and a plurality of client computers.

The network 110 may include wired connections, wireless connections, fiber optic connections, or some combination thereof. In general, the network 110 can be any combination of connections and protocols that will support communications between the computer 102 and the server computer 114. The network 110 may include various types of networks, such as, for example, a local area network (LAN), a wide area network (WAN) such as the Internet, a telecommunication network such as the Public Switched Telephone Network (PSTN), a wireless network, a public switched network, a satellite network, a cellular network (e.g., a fifth generation (5G) network, a long-term evolution (LTE) network, a third generation (3G) network, a code division multiple access (CDMA) network, etc.), a public land mobile network (PLMN), a metropolitan area network (MAN), a private network, an ad hoc network, an intranet, a fiber optic-based network, or the like, and/or a combination of these or other types of networks.

The number and arrangement of devices and networks shown in FIG. 1 are provided as an example. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of system 100 may perform one or more functions described as being performed by another set of devices of system 100.

Figure 2A:
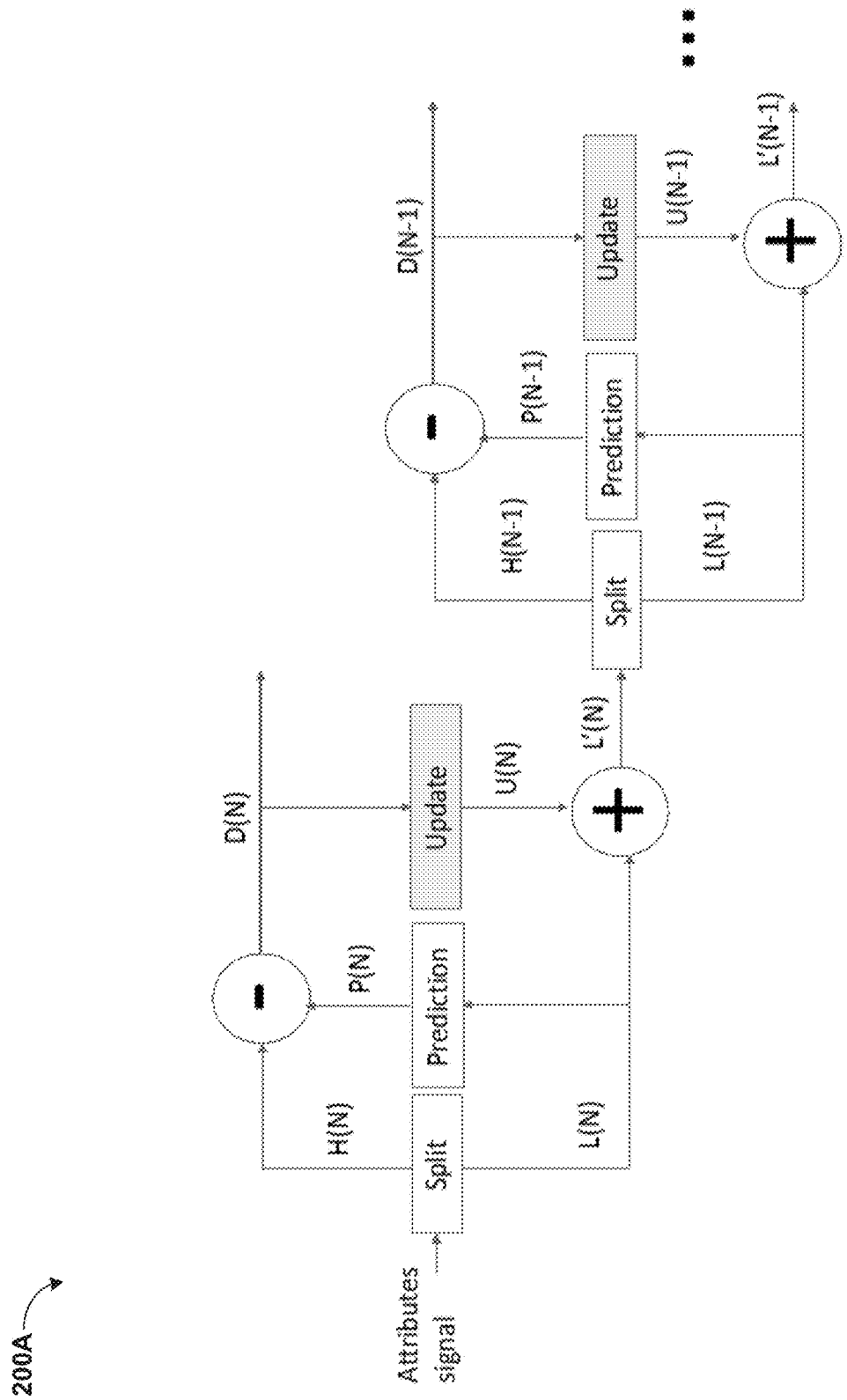
FIGS. 2A-2B are block diagrams of point cloud update systems, according to at least one embodiment.
Figure 2B:
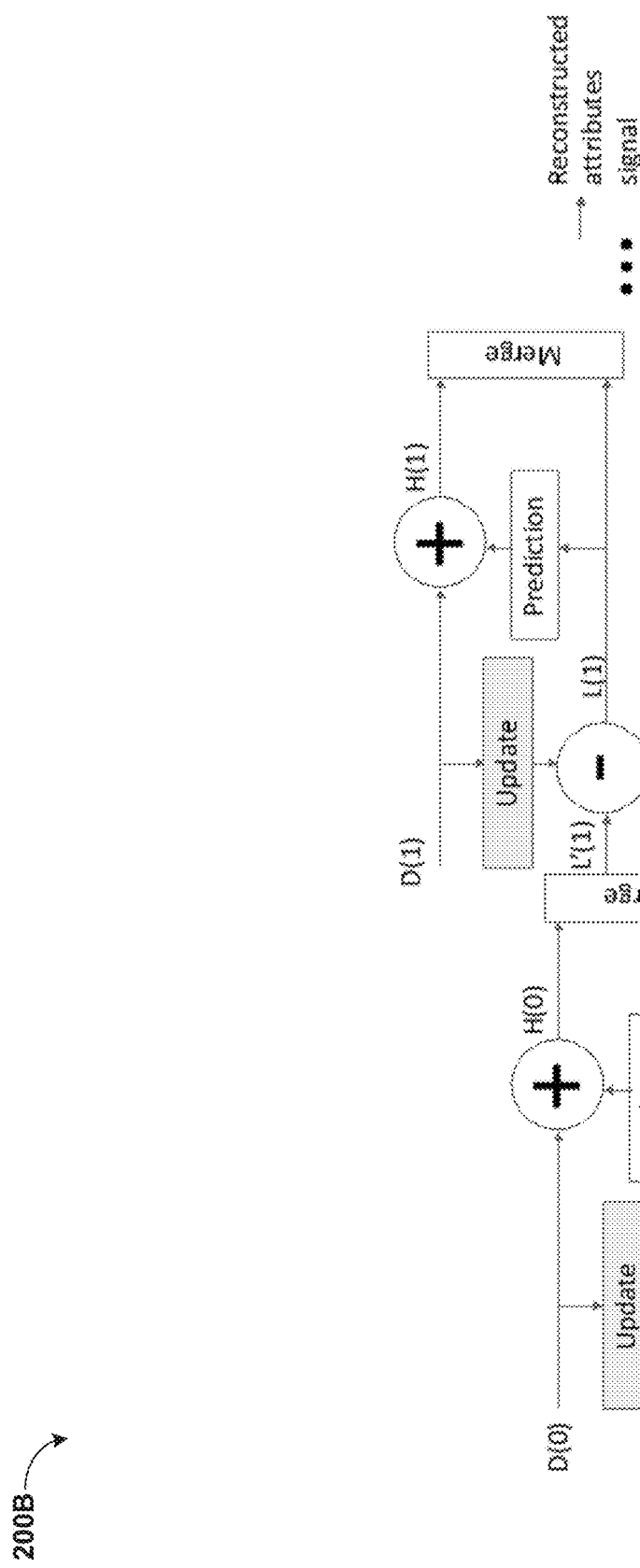

Referring now to FIGS. 2A and 2B, block diagrams 200A and 200B of point cloud update systems are depicted. Block diagram 200A may depict a direct or forward transform in the lifting scheme. Block diagram 200B may depict an inverse transform in the lifting scheme.

For prediction based attribute coding, let $(P_i)_{i=1\ldots N}$ be the set of positions associated with the point cloud points and let $(M_i)_{i=1\ldots N}$ be the Morton codes associated with $(P_i)_{i=1\ldots N}$. First, the points are sorted according to their associated Morton codes in an ascending order. Let I be the array of point indexes ordered according to this process. The encoder/decoder compresses/decompresses respectively the points according to the order defined by I. At each iteration i, a point $P_i$ is selected. The distances of $P_i$ to the s (e.g., s=64) previous points are analyzed and the k (e.g., k=3) nearest neighbors of $P_i$ are selected to be used for prediction. More precisely, the attribute values $(a_i)_{i \in 0 \ldots k-1}$ are predicted by using a linear interpolation process based on the distances of the nearest neighbours of point i. Let $\aleph_i$ be the set of the k-nearest neighbours of the current point i, and let $(\tilde{a}_j)_{j \in \aleph_i}$ be their decoded/reconstructed attribute values and $(\delta_j)_{j \in \aleph_i}$ their distances to the current point. The predicted attribute value $\hat{a}_i$ is given by:

$$\hat{a}_i = \text{Round}\left(\frac{1}{k}\sum_{j \in \aleph_i} \frac{\frac{1}{\delta_j^2}}{\sum_{j \in \aleph_i}\frac{1}{\delta_j^2}} \tilde{a}_j\right)$$

Lifting based attribute coding is built upon the prediction-based coding. The main difference compared with prediction-based scheme is that two addition steps are introduced. The first is introduction of an update operator. The second is use of an adaptive quantization strategy.

Figure 2C:
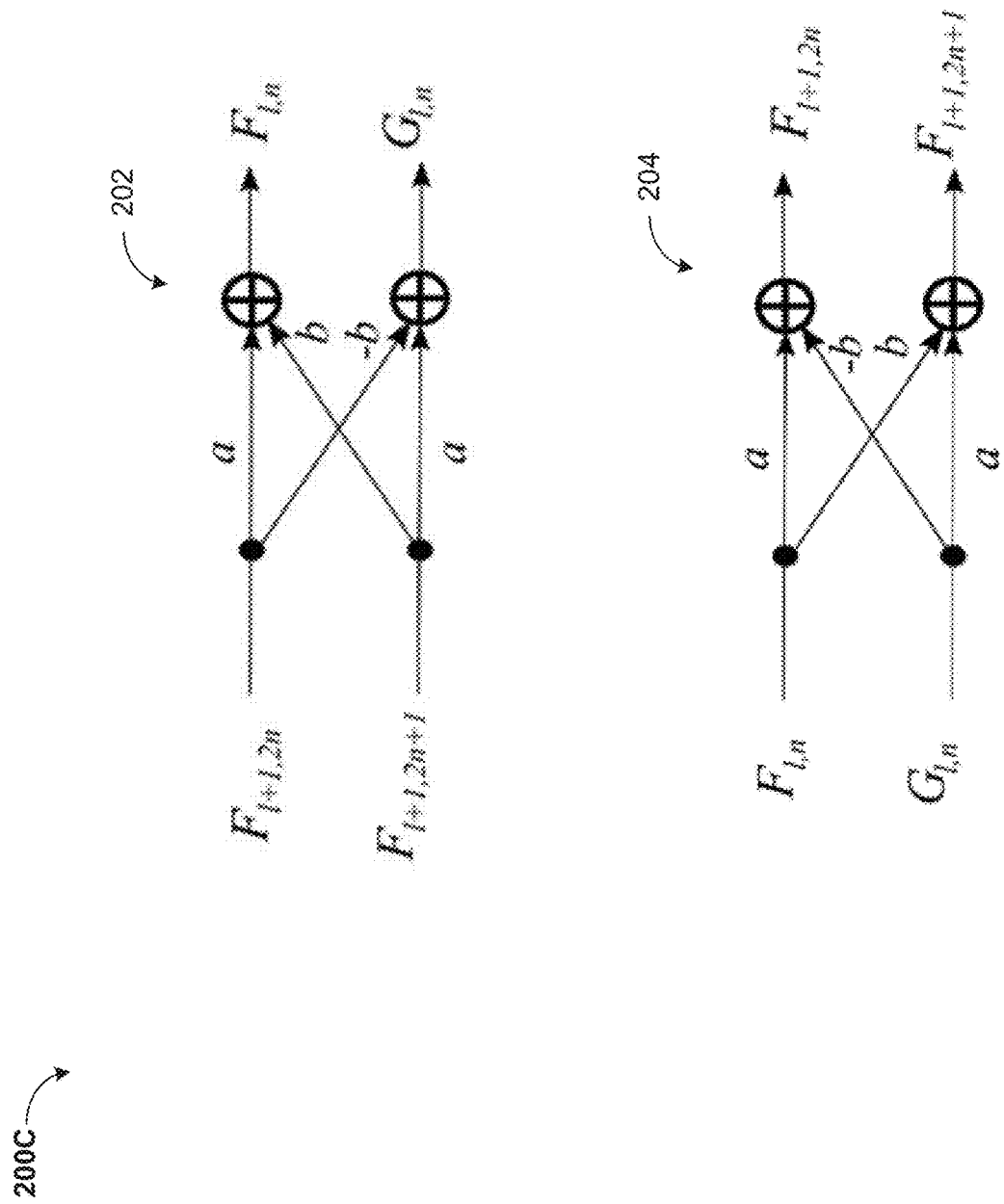
FIG. 2C is a diagram of a region adaptive hierarchical transform (RAHT), according to at least one embodiment.

Referring now to FIG. 2C, a diagram 200C of a region adaptive hierarchical transform (RAHT) is depicted. The block diagram 200C may depict a forward transform 202A and a reverse transform 202B. For RAHT coding, $$a^2 = \frac{w_0}{w_0 + w_1} \text{ and } b^2 = \frac{w_1}{w_0 + w_1},$$

and $w_0$ is the notation of the weight of the input coefficient $F_{l+1,2n}$ while $w_1$ is the same for $F_{l+1,2n+1}$.

Figure 2D:
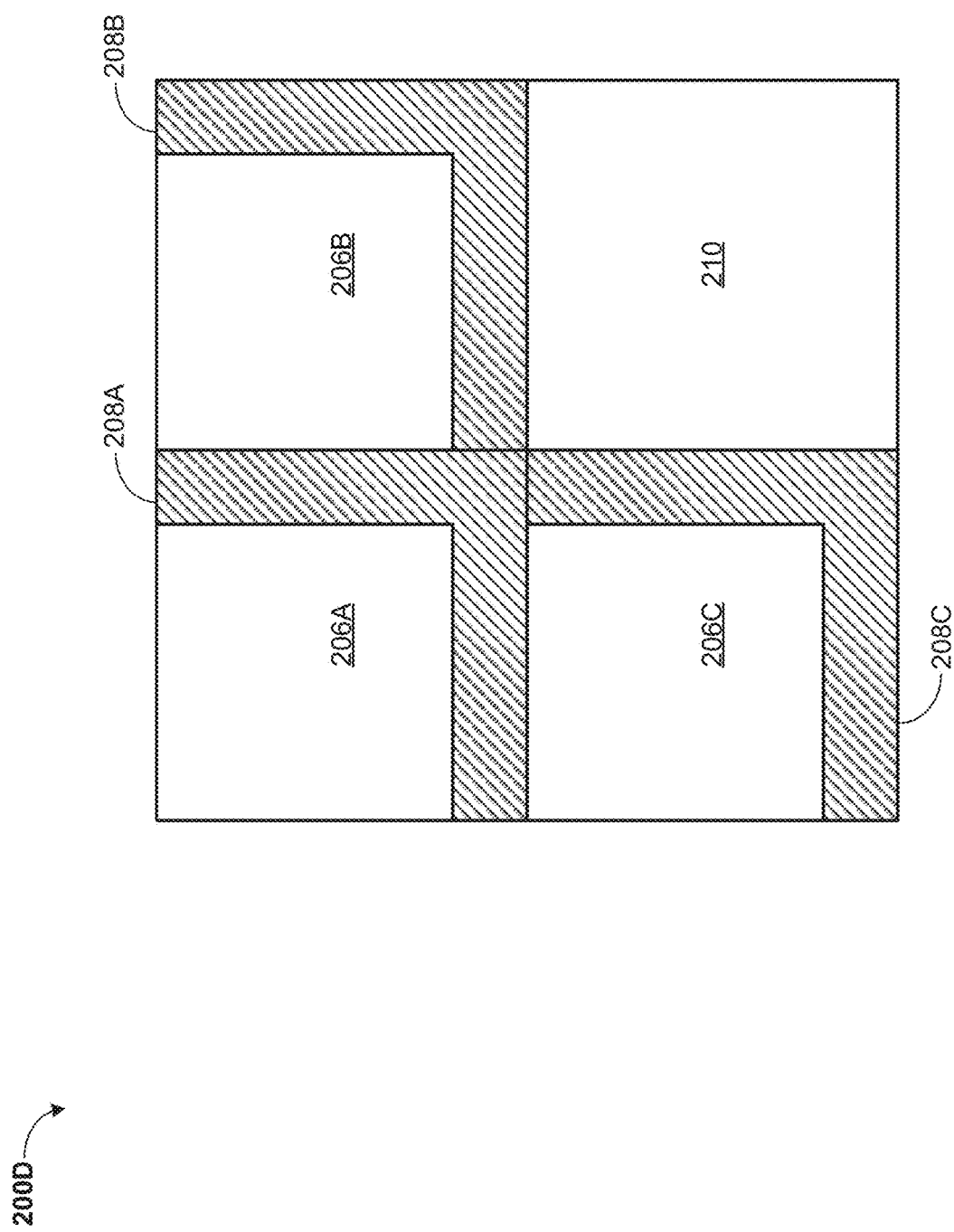
FIG. 2D is an illustration of hash shrinking while maintaining boundary elements, according to at least one embodiment.

Referring now to FIG. 2D, an illustration 200D of hash shrinking while maintaining boundary elements is depicted. The hash shrinking may include hash elements 206A-C, boundary hash elements 208A-C, and a current node 210. According to one or more embodiments, the coded geometry occupancy information may be saved in cache memory because the later coded nodes need to use this information as context.

Coded attribute information can be saved in a hash table and the later coded nodes can retrieve them as predictors. The hash table is used to store reconstructed attribute values. Specifically, a hash table H is maintained, where the key is the Morton code of the 3D coordinates of a point, i.e., $M_i=\text{Morton}(x_i, y_i, z_i)$, where $(x_i, y_i, z_i)$ is the 3D coordinates of the $i^{th}$ point. Using the Morton code $M_i$ as the key, one can access its reconstructed attribute value in the hash table H directly. If $H(M_i)$ is NULL, it indicates that the position $(x_i, y_i, z_i)$ is not occupied and there is no attribute value associated with it or the attribute associated with the position $(x_i, y_i, z_i)$ is not coded yet.

When encoding/decoding the attribute value of current point, the previously coded attributes of neighboring points are obtained from the hash table H, and used as predictors. After encoding/decoding the attribute value of the current node, the reconstructed attributes of current node are then stored in H.

Suppose current point has the geometry position at $(x_i, y_i, z_i)$, it is trivial to find the attribute values of neighbors at $(x_i-\Delta_x, y_i-\Delta_y, z_i-\Delta_z)$, where $\Delta_x$, $\Delta_y$ and $\Delta_z$ are the search step sizes with small values. However, if the search range is large, it would be time-consuming to search the space because the search space increases cubically to the search step size.

To accelerate the search, one can construct a hierarchical structure with multiple hash tables. Each hash table contains the attribute values at a certain octree partition level. For each octree partition depth d, a hash table $H_d$ is maintained, where the key is the Morton code of an octree node in depth d, i.e., $M_i^d=\text{Morton}(x_i^d, y_i^d, z_i^d)$, where $(x_i^d, y_i^d, z_i^d)$ is the 3D coordinates of the octree node in depth d. Using the Morton code $M_i^d$ as the key, one can access the attribute value in the hash table $H_d$. The attribute value stored in $H_d$ can be the averaged attributes of all the points within the corresponding octree node, or the median attribute value of all the points within the corresponding octree node, or a weighted average attribute value of all the points within the corresponding octree node. Multiple hash tables may be maintained from the leaf node level to some levels above.

When searching, a bottom-up or top-down search may be applied until enough prediction candidates are found.

To optimize/accelerate the hash implementation, keeping the hash table as small as possible may allow for the cost for storing information to be less and searching speed to be faster. In one embodiment, a maximum hash table size is defined. Note that the maximum size can be either fixed for all cases or can be configured differently case by case and sent in the bitstream as part of high-level syntax, such as sequence parameter set, geometry parameter set or slice header, etc. When the hash table reaches the maximum capacity, the hash table will shrink itself by removing partial elements in it. The rules regarding which elements are to be removed may differ in situations. In one embodiment, the hash table will remove the elements that are not at the block boundary. The block boundary can be defined according to the position coordinates of current node. Usually, the block size is defined as a power of two. For example, the block size can be $(2^M, 2^M, 2^M)$ in 3D space. Then, the points who have at least one position coordinate equals to $2^{iM}-1$ (i=1,2,3,...), are boundaries. Therefore, all the hash elements that are at boundaries are kept and all the rest elements can be deleted from the table. Elements that do not belong to boundaries can be removed. Note that the boundary size M can be either fixed for all cases or can be configured differently case by case and sent in the bitstream as part of high-level syntax, such sequence parameter set, geometry parameter set or slice header, etc.

The node-based coding method was proposed, where the whole point cloud can be partitioned into several sub-nodes via breadth-first octree partitioning and each sub-node can be coded differently or in parallel. In this scheme, each sub-node can maintain a separate hash table and each hash table from different sub-nodes is independent from each other. In this case, the maximum size of hash table is reduced as well because each sub-node is a portion of the original point cloud. However, this may introduce some performance loss in terms of coding efficiency because context information is not shared across node boundaries. To compensate the loss, in another embodiment, the elements at node boundaries are maintained and can be used for different sub-nodes.

To utilize the correlations among different components, one can apply prediction schemes in different attribute coding methods, such as prediction based attribute coding, lifting based attribute coding and RAHT based attribute coding. The cross component prediction can be applied to original signals or predictive residuals or transformation coefficients (if any transformation technique is applied such as RAHT). In the following embodiments, the prediction based attribute coding is used as examples, and the cross-component-prediction scheme is applied to prediction residuals of different channels (or components).

One can build different models to predict signals cross components, such as linear model, quadratic model and other polynomial models. In the following embodiments, the linear models are used as examples.

The cross-component prediction is not limited to RGB color attributes only, but also it can be utilized for any other attributes as long as there are more than one types of attribute to be coded and there is correlation between them. In the following embodiment, the RGB color attributes will be used as examples.

Suppose the prediction residuals for R, G and B components are $r_0$, $r_1$, $r_2$, respectively, and it is assumed that these signals are linearly correlated. These components can be coded in any order. The coding order can be either fixed for all cases, or can be configured differently case by case and specified in the bitstream as part of high-level syntax, such as sequence parameter set, geometry parameter set or slice header, etc. In the following embodiment, it is assumed that the coding order is R first followed by G and B. Therefore, when coding the prediction residuals of G, one can use the reconstructed prediction residual of R as prediction; when coding the prediction residuals of B, one can use the reconstructed prediction residuals of R and G for prediction.

More specifically, suppose the prediction residual of R component, i.e., $r_0$, is coded first, and its reconstructed value after quantization/dequantization is $R_0$. Then, the prediction residual of G component, i.e., $r_1$, can be predicted by $R_0$ as follows:

$$p_1 = \alpha_0 R_0 + \beta_0$$

where $\alpha_0$ and $\beta_0$ are linear model parameters, and $p_1$ is the predicted prediction residual of G. Therefore, instead of coding the prediction residual, i.e., $r_1$, directly, one can code the second-order residual between $r_1$ and $p_1$, i.e., $r'_1 = r_1 - p_1$. Then, the second-order residual of G, i.e., $r_1'$ is coded and its reconstructed value after quantization/dequantization is $R_1'$, and the reconstructed prediction residual of G component is $R_1 = R'_1 + p_1$. Lastly, the prediction residual of B component, i.e., $r_2$, can be predicted by both $R_0$ and $R_1$ as follows, $$p_2 = \alpha_1 R_0 + \beta_1 R_1 + \gamma_1$$

where $\alpha_1$, $\beta_1$ and $\gamma_1$ are linear model parameters, and $p_2$ is the predicted prediction residual of B. Therefore, instead of coding the prediction residual, i.e., $r_2$, directly, one can code the second-order residual between $r_2$ and $p_2$, i.e., $r'_2 = r_2 - p_2$. Then, the second-order residual of B, i.e., $r_2'$ is coded and its reconstructed value after quantization/dequantization is $R_2'$, and the reconstructed prediction residual of B component is $R_2 = R'_2 + p_2$.

The linear models in can be simplified in many ways, as suggested as follows. But note that the simplification method can be in any other similar forms. In one embodiment, the linear models are simplified as follows:

$$p_1 = \alpha_0 R_0, p_2 = \alpha_1 R_0 + \beta_1 R_1$$

where $\beta_0$ and $\gamma_1$ are fixed as zeros. In another embodiment, the linear models can be simplified as follows, $$p_1 = \alpha_0 R_0, p_2 = \alpha_1 R_0$$

where $\beta_0$ and $\gamma_1$ and $\beta_1$ are fixed as zeros. In another embodiment, the linear models can be simplified as follows, $$p_1 = \alpha_0 R_0, p_2 = \beta_1 R_1$$

where $\beta_0$ and $\gamma_1$ and $\alpha_1$ are fixed as zeros. In another embodiment, the linear models can be simplified as follows, $$p_1 = \alpha_0 R_0, p_2 = \alpha_0 R_0$$

where $\beta_0$ and $\gamma_1$ $\beta_1$ are fixed as zeros, and $\alpha_1 = \alpha_0$. In another embodiment, the linear models can be simplified as follows, $$p_1 = \alpha_0 R_0, p_2 = \alpha_1 R_1$$

where $\beta_0$ and $\gamma_1$ and $\alpha_1$ are fixed as zeros, and $\beta_1 = \alpha_0$.

In the above-mentioned linear models, the model parameters can be fixed for both encoder and decoder and for all cases. In one embodiment, one can derive the prediction as:

$$p_1 = R_0, p_2 = R_0;$$

$$p_1 = R_0, p_2 = R_1; \text{ or}$$

$$p_1 = R_0, p_2 = \frac{(R_0 + R_1)}{2}$$

However, the model parameters can be different for different point clouds, and the parameters can be signaled in high-level syntax such as in sequence parameter set, attribute parameter set or slice header etc.

In other embodiments, the model parameters can be also signaled as a "low-level syntax", meaning each coding unit (node) may have different sets of parameters.

In another embodiment, to avoid explicitly signaling the model parameters, one can adaptively learn the parameters on-the-fly from the reconstructed prediction residuals. The encoder and decoder may proceed a same training stage while coding, by minimizing the mean squared error.

Referring now to FIG. 2E, a table 200E of syntax elements for prediction residuals is depicted. To code the prediction residuals more efficiently, different attribute components may use separate contexts. In one embodiment, both R, G and B components use different context models. prediction_residual_is_zero[i] specifies if the prediction residual of the $i^{th}$ component equals to 0. prediction_residual_is_one[i] specifies if the prediction residual of the $i^{th}$ component equals to 1. prediction_residual_is_two[i] specifies if the prediction residual of the $i^{th}$ component equals to 2. prediction_residual_minus_three[i] specifies the prediction residual of the $i^{th}$ component as prediction_residual_minus_three[i]+3. In another embodiment, R component uses a separate context model, and G and B components use the same context models.

Figure 3:
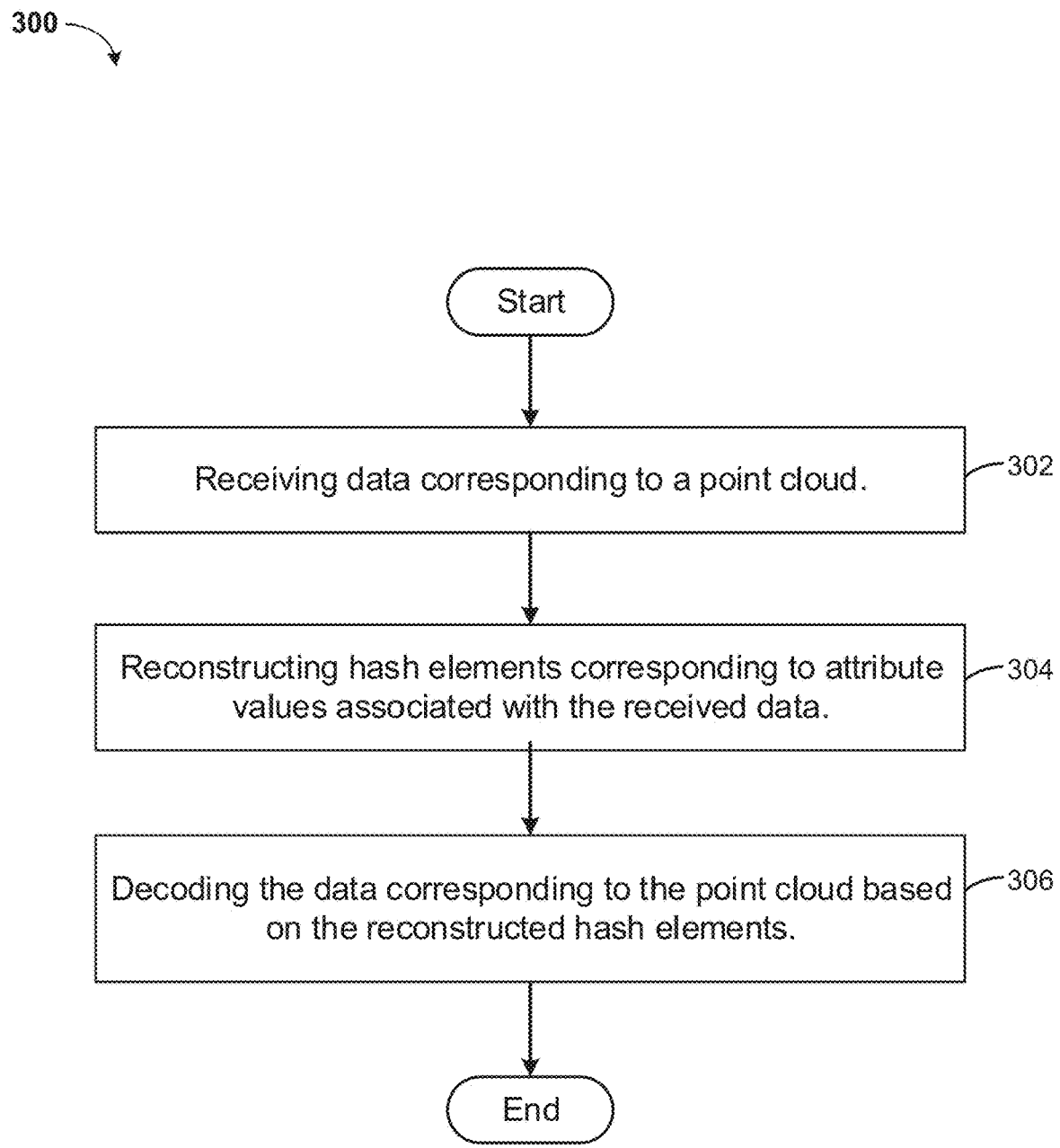
FIG. 3 is an operational flowchart illustrating the steps carried out by a program for point cloud coding, according to at least one embodiment.

Referring now to FIG. 3, an operational flowchart illustrating the steps of a method 300 carried out by a program for point cloud coding is depicted.

At 302, the method 300 may include receiving data corresponding to a point cloud.

At 304, the method 300 may include reconstructing hash elements corresponding to attribute values associated with the received data.

At 306, the method 300 may include decoding the data corresponding to the point cloud based on the reconstructed hash elements.

It may be appreciated that FIG. 3 provides only an illustration of one implementation and does not imply any limitations with regard to how different embodiments may be implemented. Many modifications to the depicted environments may be made based on design and implementation requirements.

Figure 4:
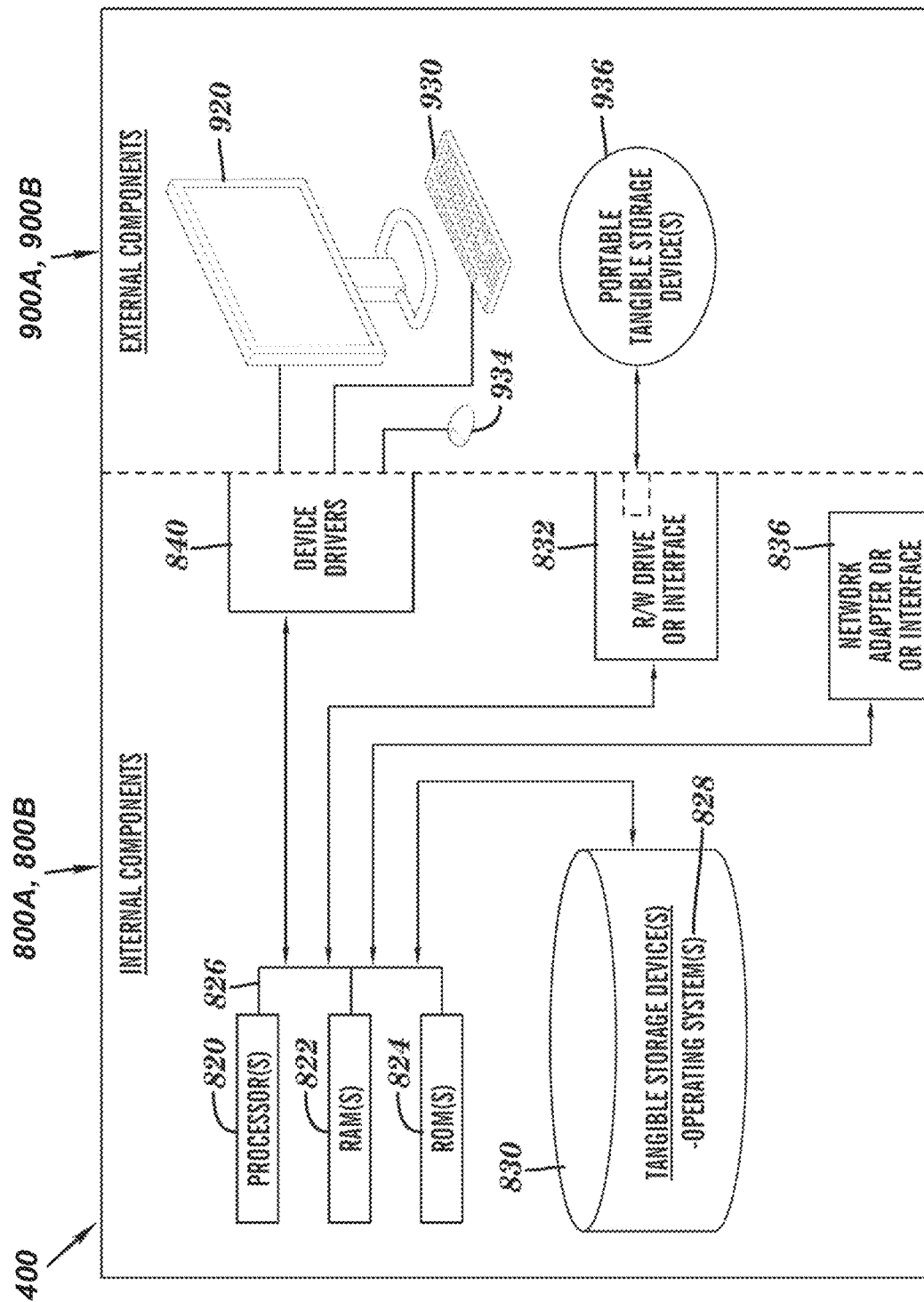
FIG. 4 is a block diagram of internal and external components of computers and servers depicted in FIG. 1 according to at least one embodiment.

FIG. 4 is a block diagram 400 of internal and external components of computers depicted in FIG. 1 in accordance with an illustrative embodiment. It should be appreciated that FIG. 4 provides only an illustration of one implementation and does not imply any limitations with regard to the environments in which different embodiments may be implemented. Many modifications to the depicted environments may be made based on design and implementation requirements.

Figure 5:
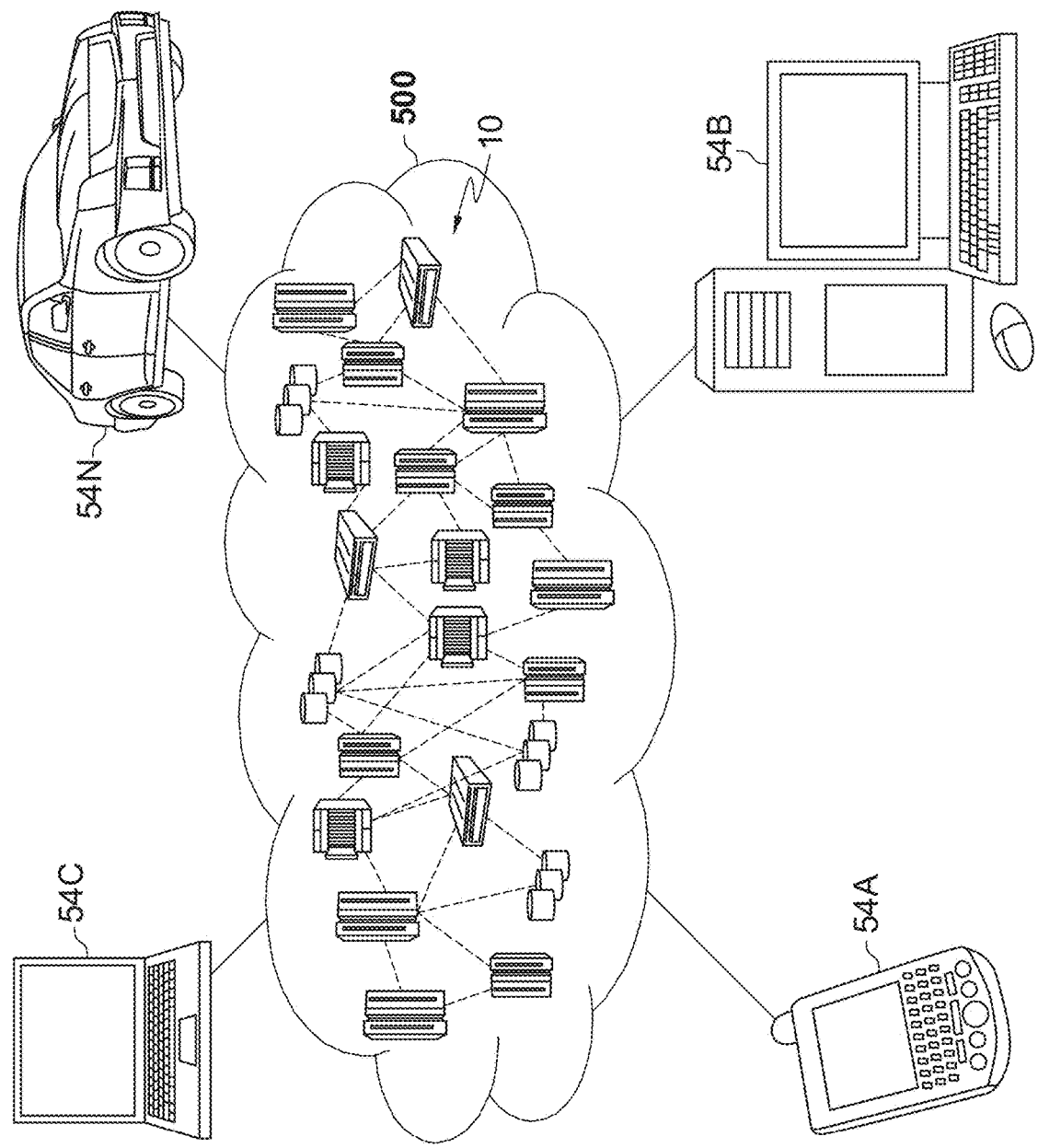
FIG. 5 is a block diagram of an illustrative cloud computing environment including the computer system depicted in FIG. 1, according to at least one embodiment.

Computer 102 (FIG. 1) and server computer 114 (FIG. 1) may include respective sets of internal components 800A,B and external components 900A,B illustrated in FIG. 5. Each of the sets of internal components 800 include one or more processors 820, one or more computer-readable RAMs 822 and one or more computer-readable ROMs 824 on one or more buses 826, one or more operating systems 828, and one or more computer-readable tangible storage devices 830.

Processor 820 is implemented in hardware, firmware, or a combination of hardware and software. Processor 820 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 820 includes one or more processors capable of being programmed to perform a function. Bus 826 includes a component that permits communication among the internal components 800A,B.

The one or more operating systems 828, the software program 108 (FIG. 1) and the Point Cloud Coding Program 116 (FIG. 1) on server computer 114 (FIG. 1) are stored on one or more of the respective computer-readable tangible storage devices 830 for execution by one or more of the respective processors 820 via one or more of the respective RAMs 822 (which typically include cache memory). In the embodiment illustrated in FIG. 4, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory, an optical disk, a magneto-optic disk, a solid state disk, a compact disc (CD), a digital versatile disc (DVD), a floppy disk, a cartridge, a magnetic tape, and/or another type of non-transitory computer-readable tangible storage device that can store a computer program and digital information.

Each set of internal components 800A,B also includes a R/W drive or interface 832 to read from and write to one or more portable computer-readable tangible storage devices 936 such as a CD-ROM, DVD, memory stick, magnetic tape, magnetic disk, optical disk or semiconductor storage device. A software program, such as the software program 108 (FIG. 1) and the Point Cloud Coding Program 116 (FIG. 1) can be stored on one or more of the respective portable computer-readable tangible storage devices 936, read via the respective R/W drive or interface 832 and loaded into the respective hard drive 830.

Each set of internal components 800A,B also includes network adapters or interfaces 836 such as a TCP/IP adapter cards; wireless Wi-Fi interface cards; or 3G, 4G, or 5G wireless interface cards or other wired or wireless communication links. The software program 108 (FIG. 1) and the Point Cloud Coding Program 116 (FIG. 1) on the server computer 114 (FIG. 1) can be downloaded to the computer 102 (FIG. 1) and server computer 114 from an external computer via a network (for example, the Internet, a local area network or other, wide area network) and respective network adapters or interfaces 836. From the network adapters or interfaces 836, the software program 108 and the Point Cloud Coding Program 116 on the server computer 114 are loaded into the respective hard drive 830. The network may comprise copper wires, optical fibers, wireless transmission, routers, firewalls, switches, gateway computers and/or edge servers.

Each of the sets of external components 900A,B can include a computer display monitor 920, a keyboard 930, and a computer mouse 934. External components 900A,B can also include touch screens, virtual keyboards, touch pads, pointing devices, and other human interface devices. Each of the sets of internal components 800A,B also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

It is understood in advance that although this disclosure includes a detailed description on cloud computing, implementation of the teachings recited herein are not limited to a cloud computing environment. Rather, some embodiments are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring to FIG. 5, illustrative cloud computing environment 500 is depicted. As shown, cloud computing environment 500 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Cloud computing nodes 10 may communicate with one another. They may be grouped (not shown) physically or virtually, in one or more networks, such as Private, Community, Public, or Hybrid clouds as described hereinabove, or a combination thereof. This allows cloud computing environment 500 to offer infrastructure, platforms and/or software as services for which a cloud consumer does not need to maintain resources on a local computing device. It is understood that the types of computing devices 54A-N shown in FIG. 5 are intended to be illustrative only and that cloud computing nodes 10 and cloud computing environment 500 can communicate with any type of computerized device over any type of network and/or network addressable connection (e.g., using a web browser).

Figure 6:
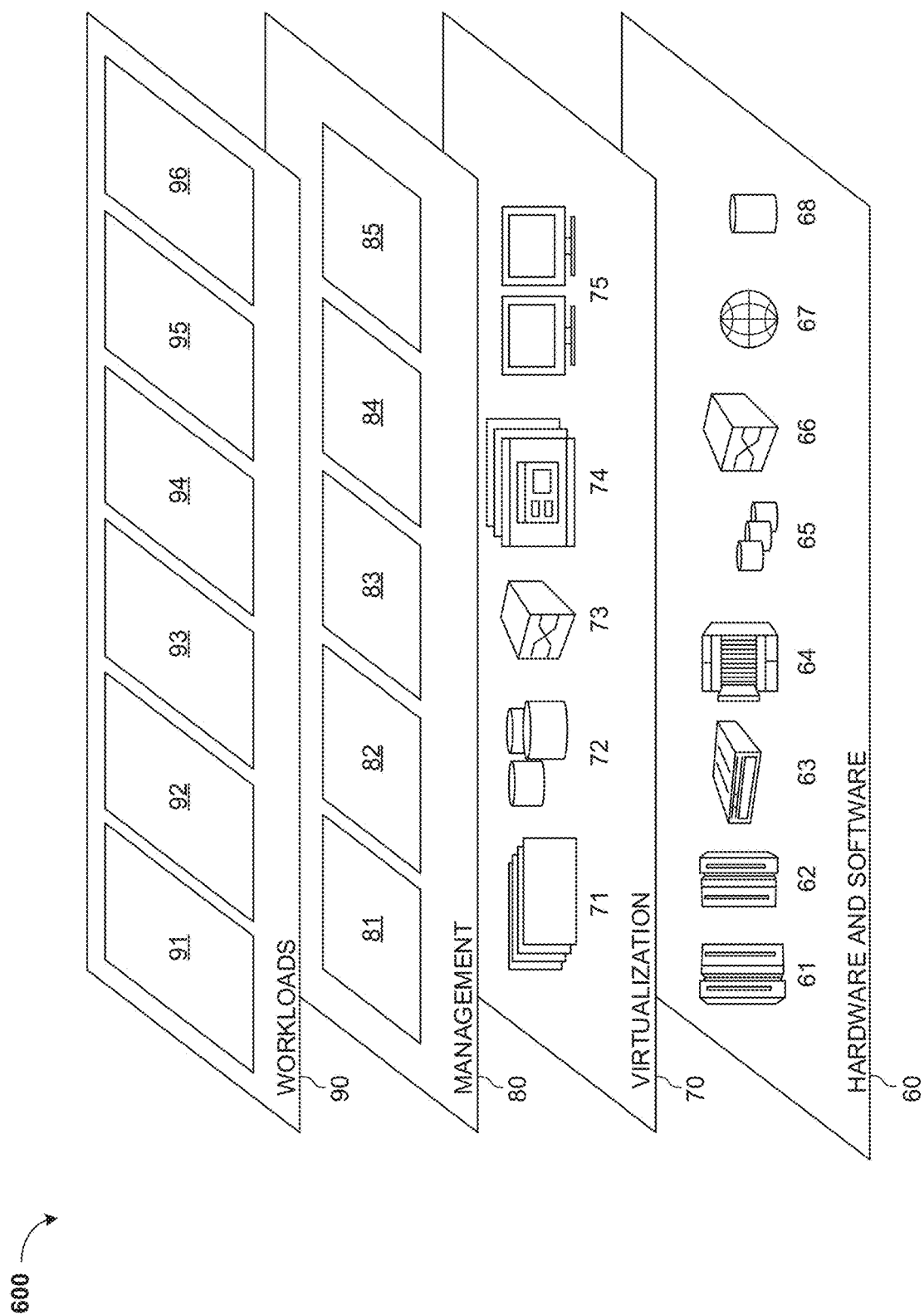
FIG. 6 is a block diagram of functional layers of the illustrative cloud computing environment of FIG. 5, according to at least one embodiment.

Referring to FIG. 6, a set of functional abstraction layers 600 provided by cloud computing environment 500 (FIG. 5) is shown. It should be understood in advance that the components, layers, and functions shown in FIG. 6 are intended to be illustrative only and embodiments are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and Point Cloud Coding 96. Point Cloud Coding 96 may decode point cloud data based on hash-based attribute coding.

Some embodiments may relate to a system, a method, and/or a computer readable medium at any possible technical detail level of integration. The computer readable medium may include a computer-readable non-transitory storage medium (or media) having computer readable program instructions thereon for causing a processor to carry out operations.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program code/instructions for carrying out operations may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects or operations.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer readable media according to various embodiments. In this regard, each block in the flowchart or block diagrams may represent a module, segment, or portion of instructions, which comprises one or more executable instructions for implementing the specified logical function(s). The method, computer system, and computer readable medium may include additional blocks, fewer blocks, different blocks, or differently arranged blocks than those depicted in the Figures. In some alternative implementations, the functions noted in the blocks may occur out of the order noted in the Figures. For example, two blocks shown in succession may, in fact, be executed concurrently or substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware may be designed to implement the systems and/or methods based on the description herein.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

The descriptions of the various aspects and embodiments have been presented for purposes of illustration, but are not intended to be exhaustive or limited to the embodiments disclosed. Even though combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of point cloud coding, executable by a processor, comprising:
   receiving data corresponding to a point cloud;
   reconstructing hash elements corresponding to attribute values associated with the received data, wherein the reconstruction is based on hash elements corresponding to attribute values at an octree partition level; and
   decoding the data corresponding to the point cloud based on the reconstructed hash elements.

2. The method of claim 1, further comprising decreasing a size of a hash table based on deleting one or more of the hash elements corresponding to non-border regions associated with the attribute values.

3. The method of claim 2, wherein a maximum size of the hash table is defined for the data corresponding to the point cloud.

4. The method of claim 3, wherein the maximum size is signaled in a sequence parameter set, a geometry parameter set, or a slice header.

5. The method of claim 3, wherein the hash table is decreased by removing partial elements from the hash table based on the hash table reaching the maximum size.

6. The method of claim 2, wherein the hash table is decreased based on a Morton order associated with the hash elements.

7. The method of claim 2, wherein a boundary size associated with the one or more neighboring nodes is signaled in a sequence parameter set, a geometry parameter set, or a slice header.

8. A computer system for point cloud coding, the computer system comprising:
   one or more computer-readable non-transitory storage media configured to store computer program code; and
   one or more computer processors configured to access said computer program code and operate as instructed by said computer program code, said computer program code including:
   receiving code configured to cause the one or more computer processors to receive data corresponding to a point cloud;
   reconstructing code configured to cause the one or more computer processors to reconstruct hash elements corresponding to attribute values associated with the received data, wherein the reconstruction is based on hash elements corresponding to attribute values at an octree partition level; and
   decoding code configured to cause the one or more computer processors to decode the data corresponding to the point cloud based on the reconstructed hash elements.

9. The computer system of claim 8, further comprising decreasing code configured to cause the one or more computer processors to decrease a size of a hash table based on deleting one or more of the hash elements corresponding to non-border regions associated with the attribute values.

10. The computer system of claim 9, wherein a maximum size of the hash table is defined for the data corresponding to the point cloud.

11. The computer system of claim 10, wherein the maximum size is signaled in a sequence parameter set, a geometry parameter set, or a slice header.

12. The computer system of claim 10, wherein the hash table is decreased by removing partial elements from the hash table based on the hash table reaching the maximum size.

13. The computer system of claim 9, wherein the hash table is decreased based on a Morton order associated with the hash elements.

14. The computer system of claim 8, wherein a boundary size associated with the one or more neighboring nodes is signaled in a sequence parameter set, a geometry parameter set, or a slice header.

15. A non-transitory computer readable medium having stored thereon a computer program for point cloud coding, the computer program configured to cause one or more computer processors to:
   receive data corresponding to a point cloud;
   reconstruct hash elements corresponding to attribute values associated with the received data, wherein the reconstruction is based on hash elements corresponding to attribute values at an octree partition level; and
   decode the data corresponding to the point cloud based on the reconstructed hash elements.

16. The computer readable medium of claim 15, wherein the computer program is further configured to cause one or more computer processors to decrease a size of a hash table based on deleting one or more of the hash elements corresponding to non-border regions associated with the attribute values.

17. The computer readable medium of claim 16, wherein a maximum size of the hash table is defined for the data corresponding to the point cloud.

18. The computer readable medium of claim 17, wherein the maximum size is signaled in a sequence parameter set, a geometry parameter set, or a slice header.

19. The computer readable medium of claim 17, wherein the hash table is decreased by removing partial elements from the hash table based on the hash table reaching the maximum size.

20. The computer readable medium of claim 16, wherein the hash table is decreased based on a Morton order associated with the hash elements.

* * * * *